United States Patent
Yanagihara et al.

(10) Patent No.: US 12,284,825 B2
(45) Date of Patent: Apr. 22, 2025

(54) SEMICONDUCTOR DEVICE INCLUDING ELECTRODES WITH IDENTICAL POTENTIAL

(71) Applicant: Panasonic Intellectual Property Management Co., Ltd., Osaka (JP)

(72) Inventors: Manabu Yanagihara, Osaka (JP); Takahiro Sato, Toyama (JP); Hiroto Yamagiwa, Hyogo (JP); Masahiro Hikita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 474 days.

(21) Appl. No.: 17/770,010

(22) PCT Filed: Oct. 29, 2020

(86) PCT No.: PCT/JP2020/040695
§ 371 (c)(1),
(2) Date: Apr. 18, 2022

(87) PCT Pub. No.: WO2021/085558
PCT Pub. Date: May 6, 2021

(65) Prior Publication Data
US 2022/0392887 A1 Dec. 8, 2022

(30) Foreign Application Priority Data
Oct. 30, 2019 (JP) .................................. 2019-197804

(51) Int. Cl.
*H10D 84/01* (2025.01)
*H10D 8/60* (2025.01)
(Continued)

(52) U.S. Cl.
CPC ............... *H10D 84/01* (2025.01); *H10D 8/60* (2025.01); *H10D 30/475* (2025.01);
(Continued)

(58) Field of Classification Search
CPC ............... H01L 27/0605; H01L 27/085; H01L 27/0629; H01L 27/0727; H01L 29/2003;
(Continued)

(56) References Cited

U.S. PATENT DOCUMENTS 9,553,087 B1 * 1/2017 Lee ...................... H10D 62/115
9,722,065 B1 * 8/2017 Lin ...................... H02M 3/1588
(Continued)

FOREIGN PATENT DOCUMENTS

EP    1168449 A2 * 1/2002 ......... H01L 27/0255
JP    2000-174259 A   6/2000
(Continued)

OTHER PUBLICATIONS

International Search Report issued on Jan. 26, 2021 in International Patent Application No. PCT/JP2020/040695, with English translation.
(Continued)

*Primary Examiner* — Ida M Soward
(74) *Attorney, Agent, or Firm* — Rimon P.C.

(57) ABSTRACT

The semiconductor device includes: a semiconductor substrate; a first transistor disposed above the semiconductor substrate and including a first source electrode, a first gate region, and a first drain electrode; and a second transistor disposed above the semiconductor substrate and including a second source electrode, a second gate region, and a second drain electrode. The first source electrode, the second gate region, and the second source electrode are substantially at an identical potential. The first drain electrode and the second drain electrode are substantially at an identical potential.

16 Claims, 8 Drawing Sheets

(51) Int. Cl.
*H10D 30/47* (2025.01)
*H10D 62/85* (2025.01)

(52) U.S. Cl.
CPC ......... *H10D 62/8503* (2025.01); *H10D 30/47* (2025.01); *H10D 30/4732* (2025.01)

(58) Field of Classification Search
CPC ............... H01L 29/7786; H01L 29/872; H01L 29/0619; H01L 29/1066; H01L 29/861; H01L 29/778; H01L 29/7783; H10D 8/60; H10D 30/475; H10D 30/47; H10D 30/4732; H10D 62/8503; H10D 62/378; H10D 84/406; H10D 84/611; H10D 84/87; H10H 20/835; H10H 29/8581
See application file for complete search history.

(56) References Cited

U.S. PATENT DOCUMENTS

| | | | | |
|---|---|---|---|---|
| 10,083,870 | B2 * | 9/2018 | Ohori | .................... H01L 27/095 |
| 2003/0098462 | A1 | 5/2003 | Yoshida | |
| 2007/0023779 | A1 * | 2/2007 | Hirose | ................ H01L 27/0255 |
| | | | | 257/173 |
| 2009/0201072 | A1 | 8/2009 | Honea et al. | |
| 2010/0109015 | A1 * | 5/2010 | Ueno | .................. H01L 29/0649 |
| | | | | 257/E29.089 |
| 2011/0193171 | A1 | 8/2011 | Yamagiwa et al. | |
| 2016/0056150 | A1 | 2/2016 | Nagai et al. | |
| 2019/0198651 | A1 | 6/2019 | Shibib et al. | |

FOREIGN PATENT DOCUMENTS

| | | | | |
|---|---|---|---|---|
| JP | 2003-229566 | A | | 8/2003 |
| JP | 2007-027334 | A | | 2/2007 |
| JP | 2007-215389 | A | | 8/2007 |
| JP | 2011-512119 | A | | 4/2011 |
| JP | 2011-165749 | A | | 8/2011 |
| JP | 2011151155 | A | * | 8/2011 |
| JP | 2015-162578 | A | | 9/2015 |
| WO | 2009/102732 | A2 | | 8/2009 |
| WO | 2014/155959 | A1 | | 10/2014 |
| WO | WO-2015194127 | A1 | * | 12/2015 ......... H01L 27/0605 |

OTHER PUBLICATIONS

Japanese Office Action dated Aug. 20, 2024 issued in the corresponding Japanese Patent Application No. 2021-553696.

* cited by examiner

SEMICONDUCTOR DEVICE INCLUDING ELECTRODES WITH IDENTICAL POTENTIAL

CROSS-REFERENCE OF RELATED APPLICATIONS

This application is the U.S. National Phase under 35 U.S.C. § 371 of International Patent Application No. PCT/JP2020/040695, filed on Oct. 29, 2020, which in turn claims the benefit of Japanese Patent Application No. 2019-197804, filed on Oct. 30, 2019, the entire disclosures of which Applications are incorporated by reference herein.

TECHNICAL FIELD

The present disclosure relates to a semiconductor device including a power transistor for switching.

BACKGROUND ART

In recent years, GaN transistors have been commercialized as power transistors for switching. As a GaN transistor, a field effect transistor is commonly used. In a field effect transistor, GaN is used as a channel layer and AlGaN is used as a barrier layer, and a two-dimensional electron gas generated by spontaneous polarization and piezoelectric polarization at the hetero-interface formed by these two layers is used as a channel. The concentration of this two-dimensional electron gas can be adjusted using the film thickness of AlGaN or the ratio of Al composition. In general, a high two-dimensional electron gas concentration reduces on-resistance, but lowers the threshold voltage. As a transistor for switching, the threshold voltage is desirable to be a high positive value for safe operation. Therefore, in GaN transistors, lowering the on-resistance and increasing the threshold voltage are in a tradeoff relation.

On the other hand, in a usage of a power transistor, a load is generally inductive. In this case, it is often necessary to allow the backflow current to flow from the source to the drain when the power transistor is turned off. A metal oxide semiconductor field-effect transistor (MOSFET), which is a power transistor that includes silicon as a semiconductor material, includes a body diode, which is a parasitic element due to the structure of the device. This body diode acts as a freewheeling diode to allow the backflow current to flow. However, it is common for GaN transistors to have no parasitic elements such as body diodes. Therefore, Patent Literature (PTL) 1 discloses a technique for including a GaN Schottky barrier diode (SBD) anti-parallel to a GaN transistor.

In addition, PTL 2 and PTL 3 each disclose a technique in which a channel formed from the drain to the source of a GaN transistor is used to allow current to flow in the reverse direction from the source to the drain. In general field effect transistors, when there is a short circuit between the gate and the source and if a value of the source voltage with respect to a value of the drain voltage (source-to-drain voltage) exceeds the threshold voltage of the transistor, current will begin to flow from the source to the drain. In a silicon MOSFET, the turn-on voltage of the body diode is approximately 0.7 V and is lower than the threshold voltage (approximately 3 V). Therefore, the backflow current flows to the body diode before flowing through the channel. In contrast, a GaN transistor does not have a body diode. In order to reduce the on-resistance, the threshold voltage is generally set to a lower voltage, which is approximately 1 V to 2 V. Therefore, when the source-to-drain voltage exceeds the threshold voltage, current automatically flows from the source to the drain through the channel of the GaN transistor.

In addition, PTL 4 discloses a technique in which a second transistor is provided to protect between the source and the gate of the first transistor from surge voltage, the gate terminal and the source terminal of the second transistor are short-circuited and connected to the source of the first transistor, and the drain terminal of the second transistor is connected to the gate of the first transistor.

CITATION LIST

Patent Literature

[PTL 1] Japanese Unexamined Patent Application Publication No. 2003-229566
[PTL 2] Japanese Unexamined Patent Application Publication No. 2007-215389
[PTL 3] Japanese Unexamined Patent Application Publication (Translation of PCT Application) No. 2011-512119
[PTL 4] Japanese Unexamined Patent Application Publication No. 2011-165749

SUMMARY OF INVENTION

Technical Problem

However, the method of including a GaN-SBD in a GaN power transistor in PTL 1 is difficult to achieve a high breakdown voltage due to large Schottky leakage of the GaN-SBD.

For example, a GaN power transistor having a breakdown voltage of 600 V or more can be made relatively easily using, for example, p-type GaN in the gate region or a metal-insulator-semiconductor (MIS) structure. In contrast, if a GaN-SBD is formed on the same chip on which a GaN power transistor is formed, it is difficult to achieve a high breakdown voltage of 600 V or more, due to large Schottky leakage. The cause of large Schottky leakage may be due to lack of a good Schottky interface between a Schottky metal and GaN due to many GaN crystal defects.

Moreover, in a GaN power transistor for switching, a negative bias is often applied to the gate to prevent false turn-on or to achieve high-speed switching. When such negative bias driving is performed and a method of passing backflow current from the source to the drain through the channel of the transistor is used, the source-to-drain voltage at which current begins to flow from the source to the drain is a value that is a sum of the threshold voltage and an absolute value of the negative bias voltage. For example, if negative bias driving of applying −3 V is performed on the gate of a GaN power transistor having a threshold voltage of 1.5 V, the backflow current will not flow unless the source-to-drain voltage exceeds 4.5 V. Therefore, for example, if negative bias driving is performed in PTLs 2 to 4, the power loss has increased when the backflow current has flowed.

In view of the above, the present disclosure aims to provide a semiconductor device that facilitates achieving a high breakdown voltage and reduces power loss when the backflow current flows, even when negative bias driving is performed.

Solution to Problem

In order to solve the above, a semiconductor device according to the present disclosure includes: a semiconductor substrate; a first transistor disposed above the semiconductor substrate and including a first source electrode, a first gate region, and a first drain electrode; and a second transistor disposed above the semiconductor substrate and including a second source electrode, a second gate region, and a second drain electrode. The first source electrode, the second gate region, and the second source electrode are substantially at an identical potential, and the first drain electrode and the second drain electrode are substantially at an identical potential.

Advantageous Effects of Invention

The semiconductor device according to the present disclosure makes it possible to facilitate achieving a high breakdown voltage and reduce power loss when backflow current flows, when the negative bias driving is performed.

DESCRIPTION OF EMBODIMENTS

The following describes embodiments in detail with reference to the drawings. Note that each of the embodiments described below shows a general or specific example. The numerical values, shapes, materials, structural elements, the arrangement and connection of the structural elements, steps and the order of the steps mentioned in the following embodiments are mere examples and not intended to limit the present disclosure. In addition, implementation forms of the present disclosure are not limited to a current independent claim, but may be expressed by other independent claims.

Each figure is a schematic diagram, and not necessarily a precise illustration. In addition, the overlapping descriptions may be omitted or simplified for each figure. In Embodiments 1 to 8, identical structural elements are assigned with the same reference signs except for the largest digits, and overlapping descriptions may be omitted.

Embodiment 1

Figure 1A:
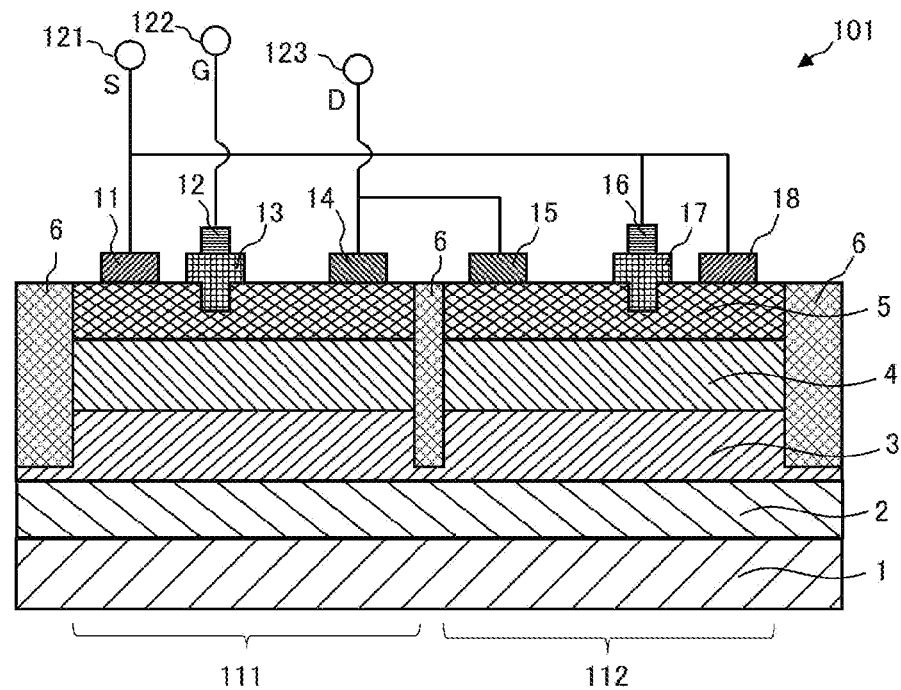
FIG. 1A is a sectional view illustrating an example of a configuration of a semiconductor device according to Embodiment 1.
Figure 1B:
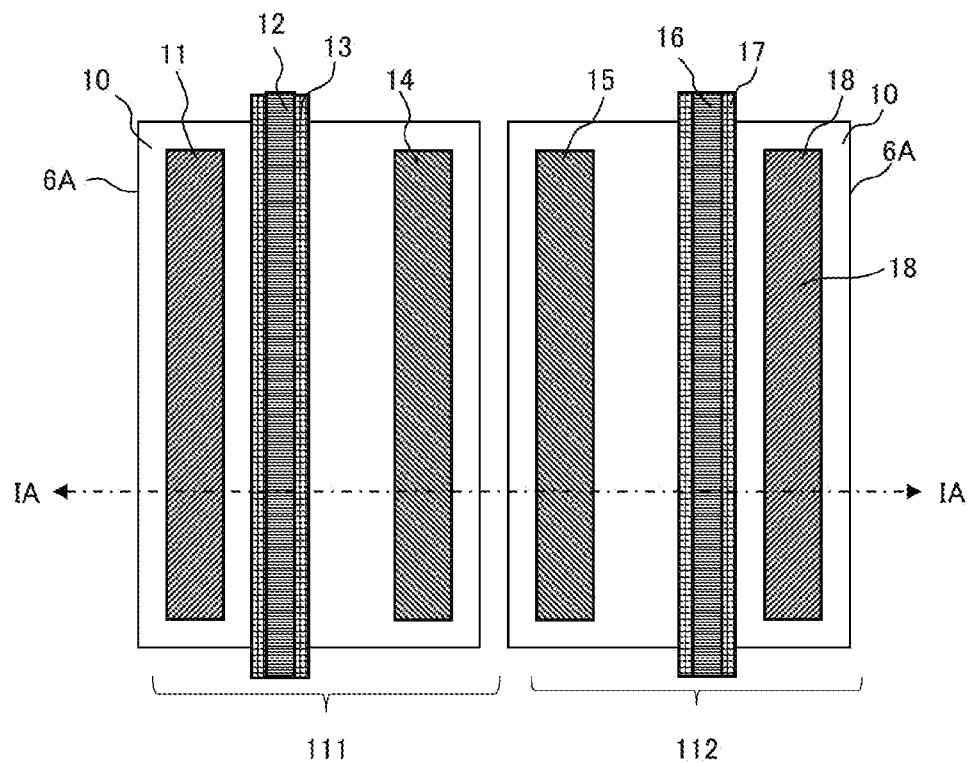
FIG. 1B is a plan view illustrating an example of the configuration of the semiconductor device according to Embodiment 1.
Figure 1C:
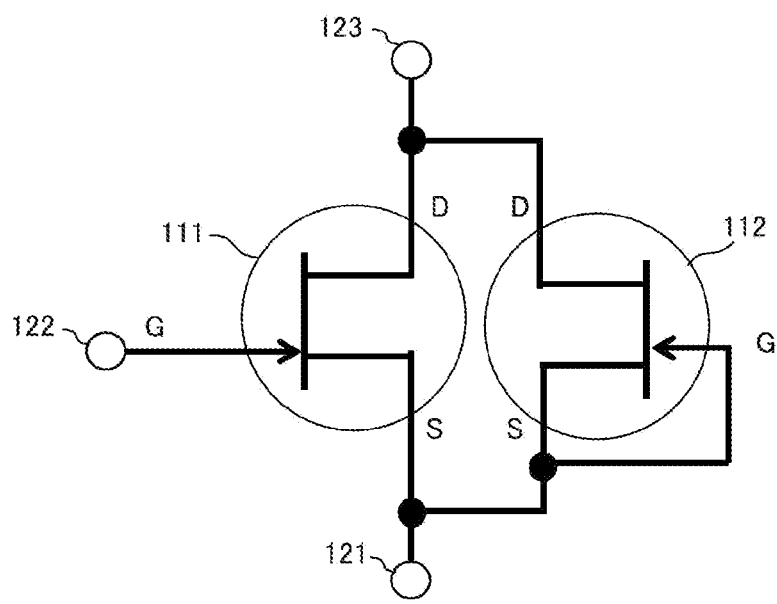
FIG. 1C is a diagram illustrating an equivalent circuit for semiconductor devices according to Embodiments 1 to 8.

FIG. 1A is a sectional view, and FIG. 1B is a plan view of semiconductor device 101 according to Embodiment 1. FIG. 1A is a sectional view taken along line IA-IA in FIG. 1B. FIG. 1C is a diagram illustrating an equivalent circuit of semiconductor device 101. Note that the equivalent circuit in FIG. 1C is common to semiconductor devices in all embodiments.

First, an example of a circuit configuration of semiconductor device 101 will be described with reference to FIG. 1C.

Semiconductor device 101 includes first transistor 111 and second transistor 112.

First transistor 111 is a power switching element that switches a high voltage. The high voltage here is, for example, 400 V or more.

The gate and the source of second transistor 112 are short-circuited and second transistor 112 functions as a diode. Such a transistor whose source and gate are short-circuited is called a transistor-type diode or a lateral-field effect rectifier, but such a transistor is collectively referred to as a transistor-type diode hereafter. Second transistor 112 operates as a freewheeling diode connected in anti-parallel to first transistor 111.

For example, if the space between the gate and the drain of first transistor 111 is equal to the space between the gate and the drain of second transistor 112, the breakdown voltage of this transistor-type diode is equal to the breakdown voltage of first transistor 111. In other words, the transistor-type diode, unlike a GaN-SBD, can easily achieve a high breakdown voltage of 600 V or more, for example. Therefore, a transistor-type diode including second transistor 112 can have a higher breakdown voltage than an SBD. Even if negative bias driving is performed in an off period of first transistor 111, such a transistor-type diode can reduce power loss.

In addition, the turn-on voltage of an SBD is determined by the height of the Schottky barrier between a semiconductor surface and a metal. In contrast, the turn-on voltage of a transistor-type diode matches the threshold voltage of the transistor. Therefore, while an SBD is difficult to adjust the turn-on voltage, a transistor-type diode can lower the turn-on voltage by properly designing the gate structure. In other words, a transistor-type diode can allow backflow current to flow at a turn-on voltage lower than a turn-on voltage of an SBD, thereby reducing loss when the turn-on voltage is applied.

In addition, when a negative bias is applied to the gate in the off period of first transistor 111, backflow current flows if the voltage between the source and the drain exceeds the turn-on voltage of the transistor-type diode, regardless of the value of the negative bias. When a channel of a power transistor is used to allow drain current to flow from the source as in the conventional technique, the backflow current does not flow unless a voltage, which is a sum of the threshold voltage of the power transistor and an absolute value of the negative bias voltage, is applied between the source and the drain of the power transistor. In contrast, since the transistor-type diode is connected in anti-parallel to first transistor 111, backflow current flows if a voltage greater than or equal to the turn-on voltage of the transistor-type diode is applied between the source and the drain. Therefore, the power loss when the backflow current flows is reduced. In other words, it is possible to reduce the power loss during the off period even when negative bias driving is performed.

Next, a specific device structure and circuit configuration of semiconductor device 101 will be described with reference to the sectional view of FIG. 1A and the plan view of FIG. 1B.

As illustrated in FIG. 1A, semiconductor device 101 includes Si substrate 1, first transistor 111, and second transistor 112. Si substrate 1 is a semiconductor substrate. First transistor 111 and second transistor 112 are formed above Si substrate 1. First transistor 111 includes first source electrode 11, first gate electrode 12, first gate region 13, and first drain electrode 14. Second transistor 112 includes second source electrode 18, second gate region 17, second gate electrode 16 and second drain electrode 15.

First source electrode 11, second gate region 17, and second source electrode 18 are substantially at an identical potential. First drain electrode 14 and second drain electrode 15 are substantially at an identical potential. Here, substantially at an identical potential typically means that the components are connected by conductive wiring, but is not limited to this. Note that since second gate region 17 is directly in contact with second gate electrode 16, second gate region 17 is substantially at a potential identical to the potential of first source electrode 11 and the potential of second source electrode 18, which are connected to second gate electrode 16 by wiring. In addition, substantially at an identical potential means not only when two or more potentials are the same, but also when they are within a tolerance. For example, the tolerance is in a range of plus or minus 5%.

Above Si substrate 1, AlN layer 2, buffer layer 3, channel layer 4 including GaN, and barrier layer 5 including AlGaN are formed as a nucleation layer. At the interface between channel layer 4 and barrier layer 5, a two-dimensional electron gas having a high concentration is formed by the effects of piezoelectric polarization and spontaneous polarization. In order to increase the resistance of the two-dimensional electron gas, element separation region 6 is formed by ion implantation. A region which is not subject to ion implantation and in which two-dimensional electron gas is present is referred to as active region 10 illustrated in FIG. 1B. The boundary between active region 10 and element separation region 6 is element separation boundary 6A. Note that, in order to reduce leakage current flowing through buffer layer 3, ion implantation for forming element separation region 6 is performed such that ions reach buffer layer 3. Examples of an ion implantation species include, but not limited to, helium, boron, nitrogen, and oxygen, which have a relatively small mass number.

First source electrode 11, first gate electrode 12, first gate region 13 including p-GaN, and first drain electrode 14 that are included in first transistor 111 are formed above Si substrate 1. Moreover, second source electrode 18, second gate electrode 16, second gate region 17 including p-GaN, and second drain electrode 15 that are included in second transistor 112 are formed above Si substrate 1. Here, each of first gate region 13 including p-GaN and second gate region 17 including p-GaN is formed to be embedded in and cover a recessed region formed in the AlGaN barrier layer 5. Such a recessed region is not necessarily needed in the present embodiment, but this recessed region has an effect of reducing the amount of two-dimensional electronic gas to be generated and making it easier to obtain a normally-off characteristic required for a power transistor to ensure safety.

As illustrated in FIG. 1A, first drain electrode 14 and second drain electrode 15 are electrically short-circuited, and first source electrode 11, second source electrode 18, and second gate electrode 16 are electrically short-circuited. Each short-circuiting may be performed by connecting these components using a wiring technique generally used for semiconductor devices. Source terminal 121, gate terminal 122, and drain terminal 123 are illustrated in FIG. 1A as external terminals of the semiconductor device. Source terminal 121, gate terminal 122, and drain terminal 123 respectively correspond to the source terminal, the gate terminal, and the drain terminal of the equivalent circuit in FIG. 1C.

In second transistor 112, second gate electrode 16, and second source electrode 18 are short-circuited. If the device is designed to have a positive threshold voltage (for example, 1.5 V), it becomes a transistor-type diode having a turn-on voltage of 1.5 V. In other words, a transistor-type diode is connected in anti-parallel to the first transistor. This transistor-type diode acts as an element that allows the backflow current of the first transistor to flow.

Moreover, in order to prevent false turn-on and achieve high-speed switching in a power transistor, driving the gate by applying a negative bias to the gate is often performed during the off period of the transistor. In a conventional GaN transistor, a channel has been often used to allow the backflow current to flow from the source to the drain. In this case, the power loss has been large because the backflow current does not flow when a voltage greater than the sum of the transistor threshold voltage and an absolute value of the negative bias voltage is not applied to the source with respect to the drain. However, in the present disclosure, since the transistor-type diode is included, even if negative bias driving is performed, the backflow current flows if a voltage greater than the threshold voltage of the second transistor included in the transistor-type diode is applied between the source and the drain. In other words, an effect that the power loss is reduced when the backflow current flows can be obtained.

As described above, the semiconductor device according to Embodiment 1 includes: Si substrate 1, which is a semiconductor substrate; first transistor 111 disposed above Si substrate 1 and including first source electrode 11, first gate region 13, and first drain electrode 14; and second transistor 112 disposed above Si substrate 1 and including second source electrode 18, second gate region 17, and second drain electrode 15. First source electrode 11, second gate region 17, and second source electrode 18 are substantially at an identical potential, and first drain electrode 14 and second drain electrode 15 are substantially at an identical potential.

With this, second transistor 112 is included in a transistor-type diode including short-circuited source and gate, and operates as a freewheeling diode connected in anti-parallel to first transistor 111. Therefore, second transistor 112 can have a higher breakdown voltage than the SBD and reduce power loss even if negative bias driving is performed during the off period of first transistor 111.

Here, first source electrode 11, first gate region 13, first drain electrode 14, second drain electrode 15, second gate region 17, and second source electrode 18 may be disposed in stated order in a specific direction.

With this, first drain electrode 14 and second drain electrode 15 can be disposed close and next to each other. This makes it possible to facilitate wiring and reduce the wiring capacity. Note that the specific direction is a direction parallel to the surface of semiconductor device 101. For example, in FIG. 1B, the specific direction is a direction parallel to the IA-IA line, among directions parallel to the surface of semiconductor device 101.

Here, the semiconductor device may include: channel layer 4, which is a first nitride semiconductor layer in which a channel of first transistor 111 and a channel of second transistor 112 are formed; and barrier layer 5, which is a second nitride semiconductor layer having a band gap larger than a band gap of channel layer 4. Channel layer 4 and barrier layer 5 may be disposed above Si substrate 1, which is a semiconductor substrate. First gate region 13 and second gate region 17 each may include a p-type nitride semiconductor.

With this, the semiconductor device includes a nitride semiconductor, which is a suitable material for a power switching element.

Embodiment 2

In Embodiment 2, an example of a configuration of a semiconductor device in which a first drain electrode and a second drain electrode are integrated in one common drain electrode will be described.

Figure 2A:
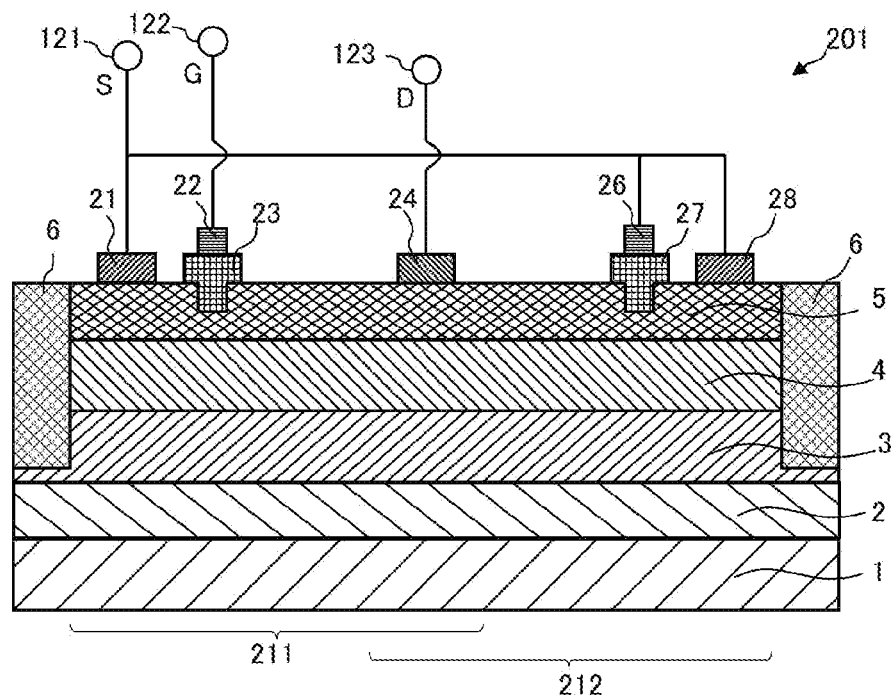
FIG. 2A is a sectional view illustrating an example of a configuration of a semiconductor device according to Embodiment 2.

FIG. 2A is a sectional view of semiconductor device 201 according to Embodiment 2.

First source electrode 21, first gate electrode 22, first gate region 23 including p-GaN, and a first drain electrode (common drain electrode 24) that are included in first transistor 211 are formed above Si substrate 1. Second source electrode 28, second gate electrode 26, second gate region 27 including p-GaN, and a second drain electrode (common drain electrode 24) that are included in second transistor 212 are formed above Si substrate 1. Here, each of first gate region 23 including p-GaN and second gate region 27 including p-GaN is formed to be embedded in and cover a recessed region formed in an AlGaN barrier layer 5. Such a recessed region is not necessarily needed in the present embodiment, but has an effect of reducing the amount of two-dimensional electronic gas to be generated and making it easier to obtain a normally-off characteristic required for a power transistor to ensure safety.

As illustrated in FIG. 2A, semiconductor device 201 includes common drain electrode 24 instead of the first drain electrode and the second drain electrode. First source electrode 21, second source electrode 28, and second gate electrode 26 are electrically short-circuited. Each short-circuiting may be performed by connecting these components using a wiring technique generally used for semiconductor devices.

In Embodiment 1, first drain electrode 14 and second drain electrode 15 are formed separately. In the present embodiment, the first drain electrode and the second drain electrode are common drain electrode 24.

This configuration reduces the drain-source capacitance of semiconductor device 201. The reasons will be described below. An electrode of a GaN transistor is generally formed on the back side of Si substrate 1 and the electrode is connected to the source to be used. In this case, the capacitance generated between the drain and the substrate of the second transistor will be added to the drain-source capacitance of the first transistor. Therefore, reducing the area of the drain electrode of the second transistor reduces the drain-source capacitance. In view of this, in Embodiment 2, the drain electrode of first transistor 211 and the drain electrode of second transistor 212 are integrated in common drain electrode 24 to reduce the sum of the areas of the drain electrodes, thereby reducing the drain-source capacitance. In addition, the wiring of the first drain electrode can be shared with the second drain electrode. Therefore, this reduces the amounts of the drain-source capacitance and the gate-drain capacitance to be generated in the wiring. When each capacitance is reduced, high-speed switching will be possible and switching loss will be reduced.

In addition, integrating the drain electrodes in common drain electrode 24 makes it possible to miniaturize the transistors and reduce the chip area.

Variation of Embodiment 2

Figure 2B:
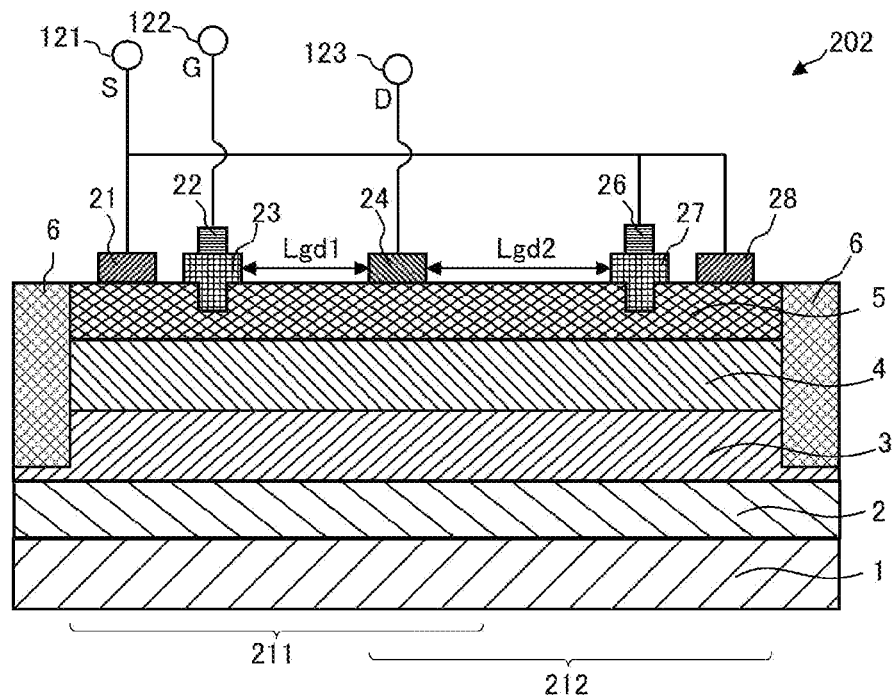
FIG. 2B is a sectional view illustrating a variation of the semiconductor device according to Embodiment 2.

FIG. 2B is a sectional view of semiconductor device 202 according to a variation of Embodiment 2.

First source electrode 21, first gate electrode 22, first gate region 23 including p-GaN, and a first drain electrode (common drain electrode 24) that are included in first transistor 211 are formed above Si substrate 1. Second source electrode 28, second gate electrode 26, second gate region 27 including p-GaN, and a second drain electrode (common drain electrode 24) that are included in second transistor 212 are formed above Si substrate 1. Here, each of first gate region 23 including p-GaN and second gate region 27 including p-GaN are formed to be embedded in and cover a recessed region formed in an AlGaN barrier layer 5. Such a recessed region is not necessarily needed in the present variation, but has an effect of reducing the amount of two-dimensional electron gas to be generated and making it easier to obtain a normally-off characteristic required as a power transistor to ensure safety.

As illustrated in FIG. 2B, the first drain electrode and the second drain electrode are common drain electrode 24. First source electrode 21, second source electrode 28, and second gate electrode 26 are electrically shorted-circuited. Each short-circuiting may be performed by connecting these components using a wiring technique generally used for semiconductor devices.

In the present variation, space Lgd2 between the gate and the drain of second transistor 212 is longer than space Lgd1 between the gate and the drain of first transistor 211. If the thicknesses of buffer layer 3 and channel layer 4 are sufficiently thick, the off-state breakdown voltage of each transistor is approximately proportional to the distance between the gate and the drain. Therefore, in the present variation, the off-state breakdown voltage of second transistor 212, that is, the reverse breakdown voltage of the transistor-type diode connected in anti-parallel to first transistor 211, is greater than the off-state breakdown voltage of first transistor 211. Therefore, the number of defects due to an insufficient breakdown voltage of the transistor-type diode will be reduced and the yield will be improved. For example, Lgd1=15 μm and Lgd2=18 μm may be appropriate.

In some applications in which transistors are used, it may be better to make space Lgd2 between the gate and the drain of second transistor 212 shorter than space Lgd1 between the gate and the drain of first transistor 211. In this case, second transistor 212 may have a function of a clamp diode that breaks down at a voltage lower than the breakdown voltage of first transistor 211 to prevent the first transistor from breaking down.

Note that space Lgd1 corresponds to the distance between first drain electrode 14 and first gate region 13 in FIG. 1A. Moreover, space Lgd2 corresponds to the distance between second drain electrode 15 and second gate region 17 in FIG. 1A.

As described above, in the semiconductor device according to Embodiment 2, first drain electrode 14 and second drain electrode 15 are integrated in common drain electrode 24.

With this, the integration of first drain electrode 14 and second drain electrode 15 allows the semiconductor device to be miniaturized. In addition, the source-drain capacitance can be reduced, and the parasitic capacitance of the wiring connected to the common drain electrode can also be reduced.

Here, space Lgd2 between second drain electrode 15 (or common drain electrode 24) and second gate region 17 (or 27) may be greater than space Lgd1 between first drain electrode 14 (or common drain electrode 24) and first gate region 13 (or 23).

With this, designing the second transistor to have a higher breakdown voltage than the breakdown voltage of the first transistor makes it possible to reduce a defect of the transistor-type diode including the second transistor and improve the yield.

Here, space Lgd2 between second drain electrode 15 (or common drain electrode 24) and second gate region 17 (or 27) may be less than space Lgd1 between first drain electrode 14 (or common drain electrode 24) and first gate region 13 (or 23).

With this, the second transistor can also function as a clamp diode that clamps between the drain and the source of the first transistor, and can serve as a protective element if a positive excessive voltage is applied between the drain and the source of the first transistor.

Embodiment 3

In Embodiment 3, an example of the configuration of a semiconductor device including a high resistance region in a bottom portion of common drain electrode 24 will be described.

Figure 3:
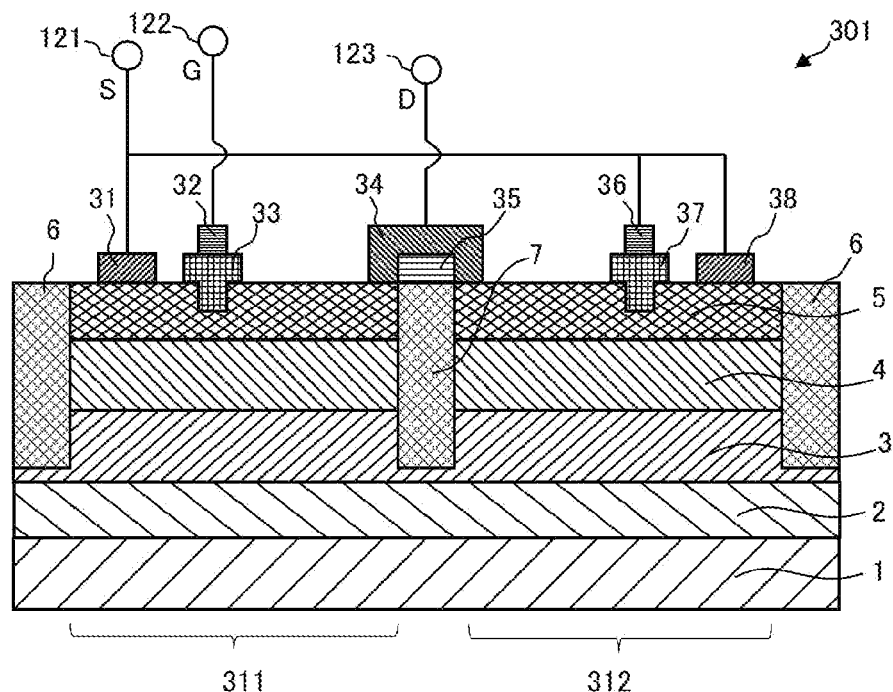
FIG. 3 is a sectional view illustrating an example of a configuration of a semiconductor device according to Embodiment 3.

FIG. 3 is a sectional view of semiconductor device 301 according to Embodiment 3.

First source electrode 31, first gate electrode 32, first gate region 33 including p-GaN, and a first drain electrode (common drain electrode 34) that are included in first transistor 311 are formed above Si substrate 1. Second source electrode 38, second gate electrode 36, second gate region 37 including p-GaN, and a second drain electrode (common drain electrode 34) that are included in second transistor 312 are formed above Si substrate 1. Here, each of first gate region 33 including p-GaN and second gate region 37 including p-GaN is formed to be embedded in and cover a recessed region formed in an AlGaN barrier layer 5. Such a recessed region is not necessarily needed in the present embodiment, but has an effect of reducing the amount of two-dimensional electronic gas to be generated and making it easier to obtain a normally-off characteristic required for a power transistor to ensure safety.

As illustrated in FIG. 3, the first drain electrode and the second drain electrode are common drain electrode 34. First source electrode 31, second source electrode 38, and second gate electrode 36 are electrically shorted-circuited. Each short-circuiting may be performed by connecting these components using a wiring technique generally used for semiconductor devices.

In the present embodiment, high resistance region 7 is formed below a middle portion of common drain electrode 34. High resistance region 7 can be formed simultaneously with element separation region 6. Therefore, the number of processing steps does not increase. Furthermore, insulating film 35 is formed between common drain electrode 34 and high resistance region 7. This configuration reduces the capacitance to be generated between common drain electrode 34 and Si substrate 1, thereby reducing the drain-source capacitance of semiconductor device 301.

As described above, in the semiconductor device according to Embodiment 3, high resistance region 7 is below common drain electrode 34.

With this, the parasitic capacitance between common drain electrode 34 and Si substrate 1 can be reduced, thereby reducing the parasitic capacitance between the source and the drain.

Embodiment 4

In Embodiment 4, an example of the configuration of a semiconductor device in which the second gate region is in contact with the second source electrode will be described.

Figure 4:
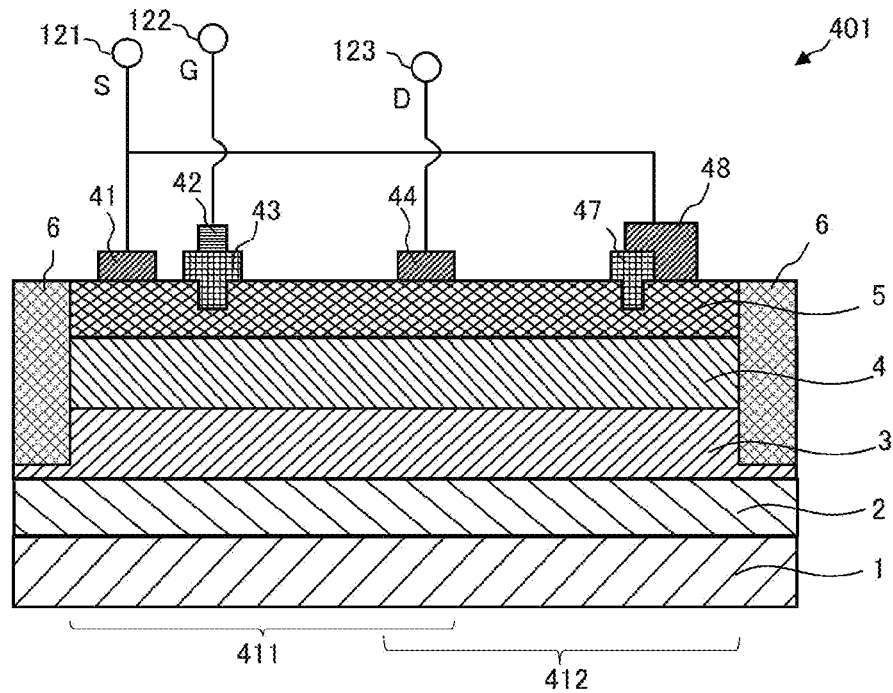
FIG. 4 is a sectional view illustrating an example of a configuration of a semiconductor device according to Embodiment 4.

FIG. 4 is a sectional view of semiconductor device 401 according to Embodiment 4.

Above Si substrate 1, first source electrode 41, first gate electrode 42, first gate region 43 including p-GaN, and a first drain electrode (common drain electrode 44) that are included in first transistor 411 are formed. In addition, second source electrode 48, second gate region 47 including p-GaN, and a second drain electrode (common drain electrode 44) that are included in second transistor 412 are formed. Here, each of first gate region 43 including p-GaN and second gate region 47 including p-GaN are formed to be embedded in and cover a recessed region formed in an AlGaN barrier layer 5. Such a recessed region is not necessarily needed in the present embodiment, but has an effect of reducing the amount of two-dimensional electronic gas to be generated and making it easier to obtain a normally-off characteristic required for a power transistor to ensure safety.

As illustrated in FIG. 4, the first drain electrode and the second drain electrode are common drain electrode 44, and first source electrode 41 and second source electrode 48 are electrically short-circuited. The short-circuiting of first source electrode 41 and second source electrode 48 may be performed by connecting these components using the wiring technology generally used for semiconductor devices.

In the present embodiment, second source electrode 48 is formed to cover second gate region 47 including p-GaN. Therefore, second source electrode 48 also serves as the gate electrode of second transistor 412. This configuration makes it possible to narrow second gate region 47, resulting in a smaller element area. In addition, the region that is electrically short-circuited to the source electrode in semiconductor device 401 is reduced, thereby reducing the gate-source capacitance.

As described above, in the semiconductor device according to Embodiment 4, second gate region 47 and second source electrode 48 are in contact with each other.

With this, the semiconductor device can be miniaturized.

Embodiment 5

In Embodiment 5, an example of a configuration of a semiconductor device will be described. In the semiconductor device according to Embodiment 5, the depth of a recessed region formed in each of the first gate region and the second gate region is adjusted to make it possible to set the threshold voltage of the second transistor to be a positive value lower than the threshold voltage of the first transistor.

Figure 5:
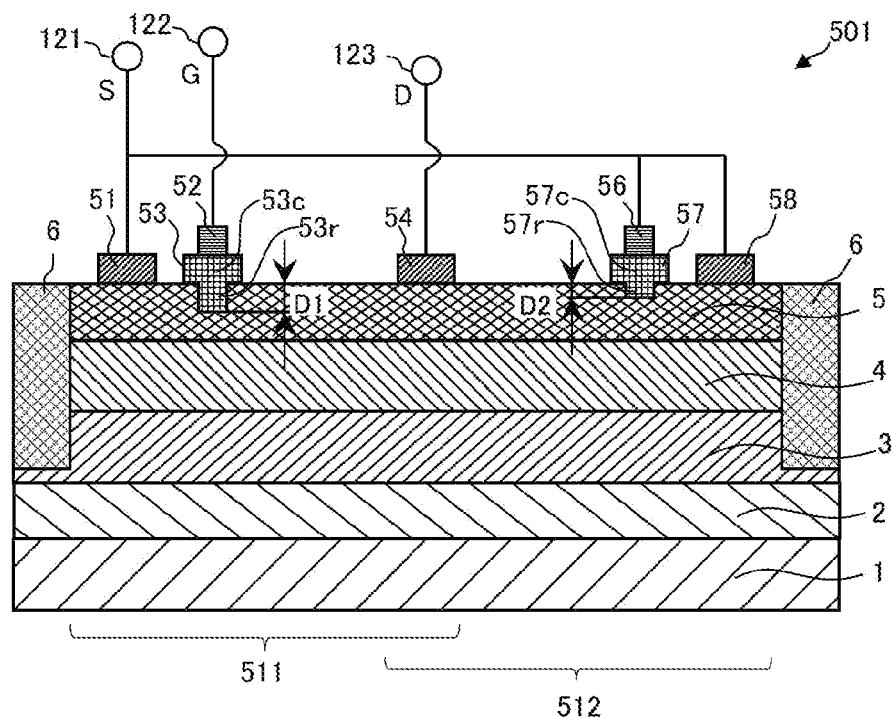
FIG. 5 is a sectional view illustrating an example of a configuration of a semiconductor device according to Embodiment 5.

FIG. 5 is a sectional view of semiconductor device 501 according to Embodiment 5.

First source electrode 51, first gate electrode 52, first gate region 53 including p-GaN, and a first drain electrode (common drain electrode 54) that are included in first transistor 511 are formed above Si substrate 1. Second source electrode 58, second gate electrode 56, second gate region 57 including p-GaN, and a second drain electrode (common drain electrode 54) that are included in second transistor 512 are formed above Si substrate 1. Here, each of first gate region 53 including p-GaN and second gate region 57 including p-GaN is formed to be embedded in and cover a recessed region formed in an AlGaN barrier layer 5.

As illustrated in FIG. 5, the first drain electrode and the second drain electrode are common drain electrode 54. First source electrode 51, second source electrode 58, and second gate electrode 56 are electrically short-circuited. Each short-circuiting may be performed by connecting these components using a wiring technique generally used for semiconductor devices.

In the present embodiment, first gate region 53 includes first portion 53r and first cover portion 53c. First portion 53r is a portion of first gate region 53 and is embedded in the recessed region in barrier layer 5. First cover portion 53c is a portion of first gate region 53 and covers first portion 53r.

Similarly, second gate region 57 includes second portion 57r and second cover portion 57c. Second portion 57r is a portion of second gate region 57 and is embedded in the recessed region in barrier layer 5. Second cover portion 57c is a portion of second gate region 57 and covers second portion 57r.

As illustrated in FIG. 5, depth D2 of second portion 57r is less than depth D1 of first portion 53r. In other words, depth D2 of the recessed region of second transistor 512 is less than depth D1 of the recessed region of first transistor 511. In addition, the values of depth D1 and depth D2 are set such that threshold voltage Vth2 of the second transistor becomes a positive value. With this configuration, threshold voltage Vth2 of second transistor 512 is a positive value lower than threshold voltage Vth1 of first transistor 511. As a result, the turn-on voltage of the transistor-type diode, which includes second transistor 512, is lowered, and the power loss when the backflow current flows is reduced. For example, the value of D1 may be set such that threshold voltage Vth1 of first transistor 511 becomes 1.5 V, and the value of D2 may be set such that threshold voltage Vth2 of second transistor 512 becomes 0.7 V.

In order to achieve the present embodiment, the recess etching process for first gate region 53 may be performed separately from the recess etching process for second gate region 57. However, if the length of the recess in second gate region 57 is designed to be a dimension that slows the rate of dry etching, the number of times the recess etching process to be performed may be one time. For example, the length of the recess in first gate region 53 may be approximately 0.6 µm and the length of the recess in second gate region 57 may be approximately 0.2 µm.

As described above, in the semiconductor device according to Embodiment 5, threshold voltage Vth2 of second transistor 512 is a positive value lower than threshold voltage Vth1 of first transistor 511.

With this, power loss during the off period of the first transistor can be further reduced.

Here, first gate region 53 includes: first portion 53r embedded in the recessed region of barrier layer 5, which is a second nitride semiconductor layer; and first cover portion 53c that covers first portion 53r. Second gate region 57 includes: second portion 57r embedded in an other recessed region of barrier layer 5; and second cover portion 57c that covers second portion 57r. Depth D2 of second portion 57r is less than depth D1 of the first portion.

With this, threshold voltage Vth2 of second transistor 512 can be lower than threshold voltage Vth1 of first transistor 511, according to the designed values for depth D1 and depth D2.

Embodiment 6

In Embodiment 6, an example of a configuration of a semiconductor device will be described. In the semiconductor device, threshold voltage Vth2 of the second transistor can be set to a positive value lower than threshold voltage Vth1 of the first transistor by adjusting the width of each of the first gate region and the second gate region.

Figure 6:
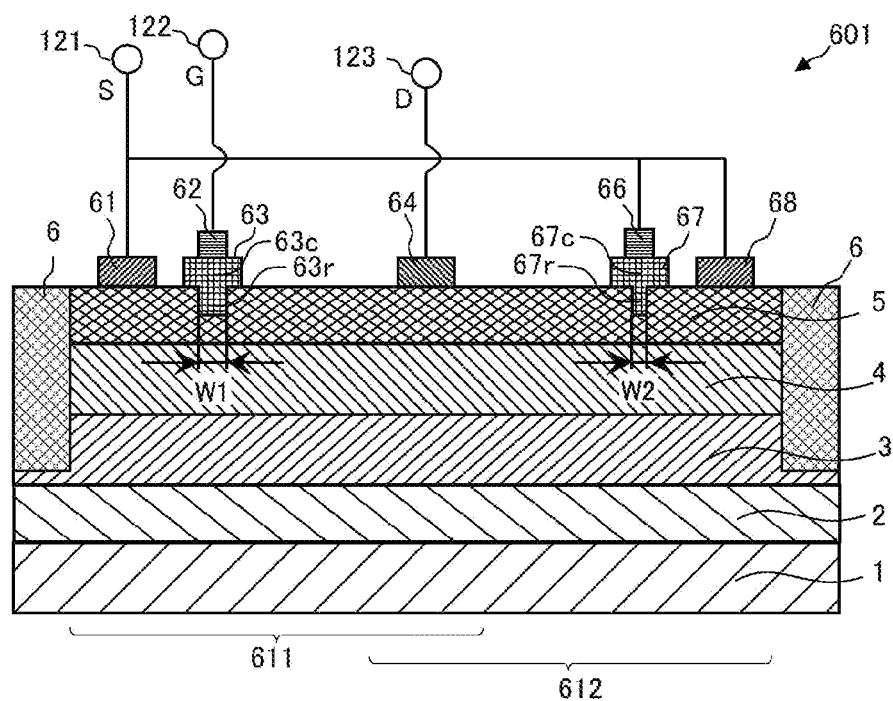
FIG. 6 is a sectional view illustrating an example of a configuration of a semiconductor device according to Embodiment 6.

FIG. 6 is a sectional view of semiconductor device 601 according to Embodiment 6.

First source electrode 61, first gate electrode 62, first gate region 63 including p-GaN, and a first drain electrode (common drain electrode 64) that are included in first transistor 611 are formed above Si substrate 1. Second source electrode 68, second gate electrode 66, second gate region 67 including p-GaN, and a second drain electrode (common drain electrode 64) that are included in second transistor 612 are formed above Si substrate 1. Here, each of first gate region 63 including p-GaN and second gate region 67 including p-GaN is formed to be embedded in and cover a recessed region formed in an AlGaN barrier layer 5.

As illustrated in FIG. 6, the first drain electrode and the second drain electrode are common drain electrode 64. First source electrode 61, second source electrode 68, and second gate electrode 66 are electrically shorted-circuited. Each short-circuiting may be performed by connecting these components using a wiring technique generally used for semiconductor devices.

In the present embodiment, first gate region 63 includes first portion 63r and first cover portion 63c. First portion 63r is a portion of first gate region 63 and is embedded in the recessed region of barrier layer 5, which is a second nitride semiconductor layer. First cover portion 63c is a portion of first gate region 63 and covers first portion 63r.

Similarly, second gate region 67 includes second portion 67r and second cover portion 67c. Second portion 67r is a portion of second gate region 67 and is embedded in the recessed region in barrier layer 5. Second cover portion 67c is a portion of second gate region 67 and covers second portion 67r.

As illustrated in FIG. 6, width W2 of second portion 67r is narrower than width W1 of first portion 63r. In other words, width W2 of the recessed region of second transistor 612 is smaller than width W1 of the recessed region of first transistor 611 to a degree that a short-channel effect occurs. This configuration makes it possible to lower threshold voltage Vth2 of second transistor 612 to be a positive value lower than threshold voltage Vth1 of first transistor 611. As a result, the turn-on voltage of the transistor-type diode including second transistor 612 is lowered, and the power loss when the backflow current flows is reduced. For example, width W1 may be set to a value such that threshold voltage Vth1 of first transistor 611 becomes 1.5 V, and set width W2 to be a value such that threshold voltage Vth2 of second transistor 612 becomes 0.7 V. As specific widths of the recessed regions, width W1 may be approximately 0.5 µm and width W2 may be approximately 0.1 µm.

In the present embodiment, the two recessed regions can be simultaneously formed by etching. Therefore, this also has an effect of not increasing the number of processing steps.

As described above, in the semiconductor device according to Embodiment 6, first gate region 63 includes: first portion 63r embedded in a recessed region of barrier layer 5, which is the second nitride semiconductor layer; and first cover portion 63c that covers first portion 63r. Second gate region 67 includes: second portion 67r embedded in an other recessed region of the second nitride semiconductor layer; and second cover portion 67c that covers second portion 67r. Width W2 of second portion 67r is less than width W1 of first portion 63r.

With this, threshold voltage Vth2 of second transistor 612 can be lower than threshold voltage Vth1 of first transistor 611, according to the designed values of width W1 and width W2.

Embodiment 7

Embodiment 7 describes an example of a semiconductor device that efficiently arranges multiple unit transistors each including the first transistor and the second transistor.

Figure 7A:
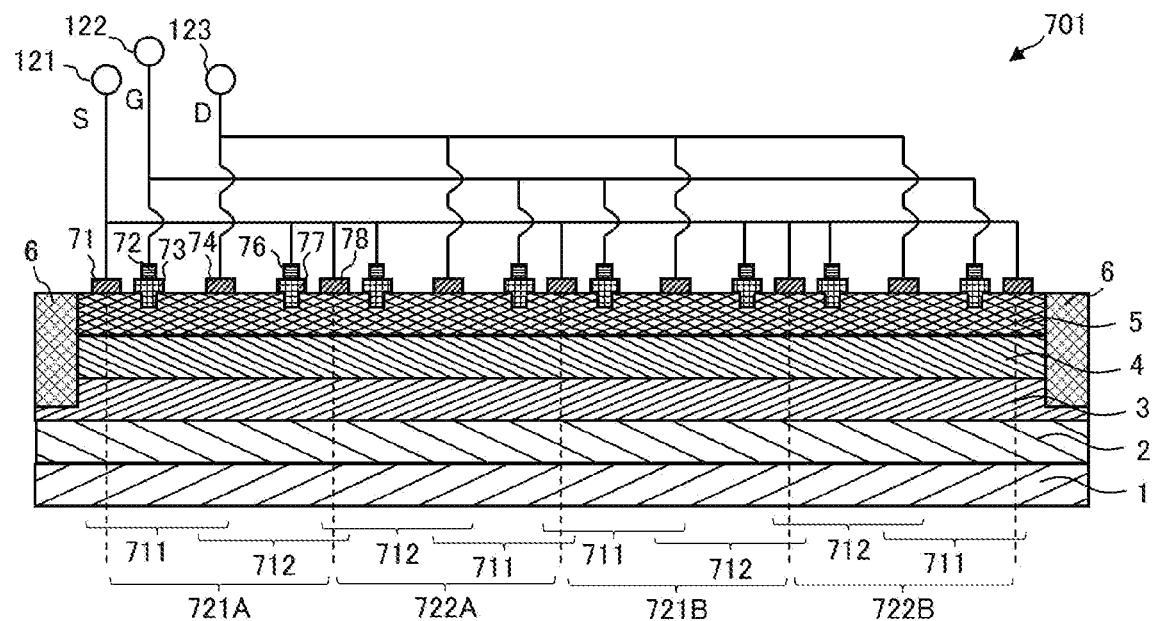
FIG. 7A is a sectional view illustrating an example of a configuration of a semiconductor device according to Embodiment 7.
Figure 7B:
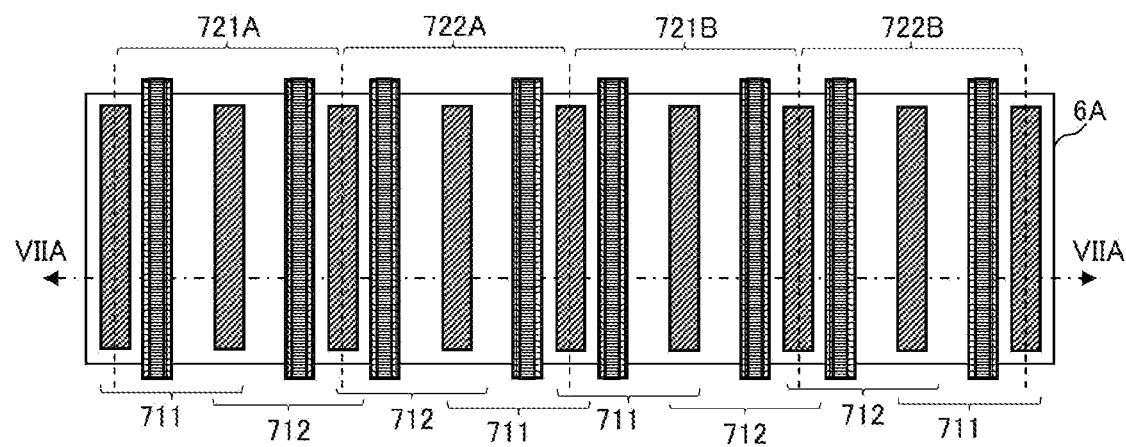
FIG. 7B is a plan view illustrating an example of the configuration of the semiconductor device according to Embodiment 7.

FIG. 7A is a sectional view, and FIG. 7B is a plan view of semiconductor device 701 according to Embodiment 7. Note that FIG. 7A is a sectional view taken along the VIIA-VIIA line in FIG. 7B.

First source electrode 71, first gate electrode 72, first gate region 73 including p-GaN, and a first drain electrode (common drain electrode 74) that are included in first transistor 711 are formed above Si substrate 1. Second source electrode 78, second gate electrode 76, second gate region 77 including p-GaN, and a second drain electrode (common drain electrode 74) that are included in second transistor 712 are formed above Si substrate 1. Here, each of first gate region 73 including p-GaN and second gate region 77 including p-GaN is formed to be embedded in and cover a recessed region formed in an AlGaN barrier layer 5. Such a recessed region is not necessarily needed in Embodiment 7, but has an effect of reducing the amount of two-dimensional electronic gas to be generated and making it easier to obtain a normally-off characteristic required as a power transistor to ensure safety.

As illustrated in FIG. 7A and FIG. 7B, the first drain electrode and the second drain electrode are common drain electrode 74. First source electrode 71, second source electrode 78, and second gate electrode 76 are electrically short-circuited. Each short-circuiting may be performed by connecting these components using a wiring technique generally used for semiconductor devices.

Here, the region between (i) the center line of first source electrode 71, which is closer to the left than second source electrode 78 is in the diagram, and (ii) the center line of second source electrode 78 is defined as unit transistor 721A. The layout of unit transistor 722A is obtained by arranging the layout of unit transistor 721A to be in reflection symmetry with respect to the center line of the second source electrode. Similarly, the layout of unit transistor 721B is obtained by arranging the layout of unit transistor 722A to be in reflection symmetry with respect to the center line of the first source electrode. This is repeated until a gate width desired as a power transistor is obtained to produce a necessary power transistor layout. The reflection symmetry here refers to the reflection symmetry in which the VIIA-VIIA line is the normal line with respect to the line of reflection in FIG. 7A and FIG. 7B.

In the present embodiment, Embodiment 2 is used to describe the embodiment, but other embodiments may be used. For example, if a space between unit transistors needs to be increased to improve heat dissipation, element separation region 6 between first transistor 111 and second transistor 112 in Embodiment 1 in FIG. 1A may be increased. It is also possible to use Embodiment 3 and increase the area of high resistance region 7.

As described above, the semiconductor device in Embodiment 7 includes a plurality of unit transistors. Each of the plurality of unit transistors includes first transistor 711 and second transistor 712, the plurality of unit transistors are aligned in the specific direction, and an internal configuration of each of the plurality of unit transistors is in reflection symmetry with an internal configuration of an adjacent unit transistor in a plan view of the semiconductor substrate.

With this, multiple unit transistors can be efficiently arranged.

Embodiment 8

Embodiment 8 describes an example of a configuration of a semiconductor device in which the first source electrode and the second source electrode are integrated in one common source electrode.

Figure 8A:
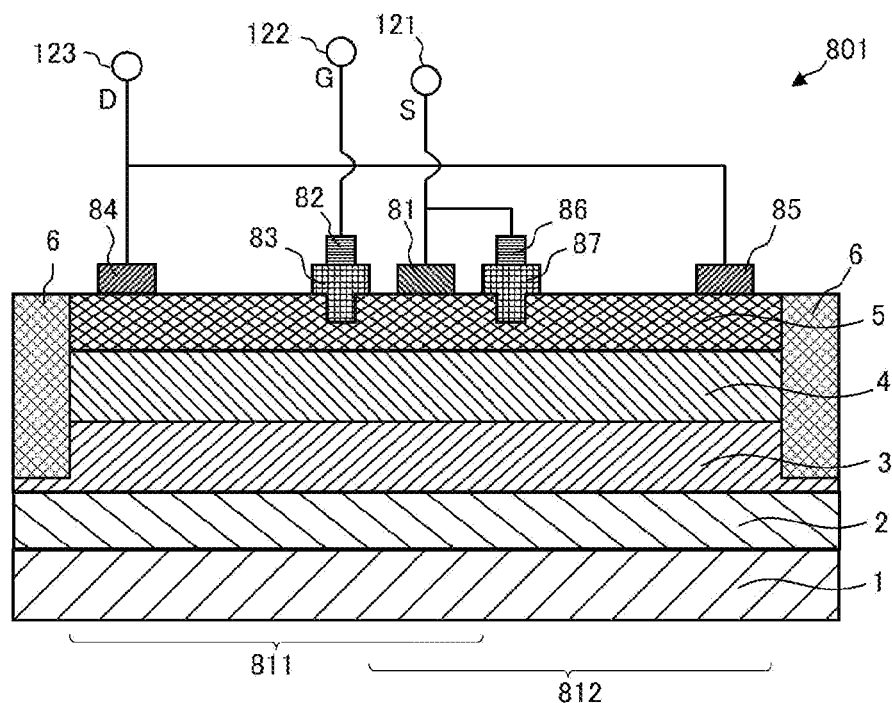
FIG. 8A is a sectional view illustrating an example of a configuration of a semiconductor device according to Embodiment 8.

FIG. 8A is a sectional view of semiconductor device 801 according to Embodiment 8.

Above Si substrate 1, first drain electrode 84, first gate electrode 82, first gate region 83 including p-GaN, a first source electrode (common source electrode 81) that are included in first transistor 811 are formed. In addition, second drain electrode 85, second gate electrode 86, and second gate region 87 including p-GaN, and a second source electrode (common source electrode 81) that are included in second transistor 812 are formed. Here, each of first gate region 83 including p-GaN and second gate region 87 including p-GaN is formed to be embedded in and cover a recessed region formed in an AlGaN barrier layer 5. Such a recessed region is not necessarily needed in Embodiment 8, but has an effect of reducing the amount of two-dimensional electronic gas to be generated and making it easier to obtain a normally-off characteristic required as a power transistor to ensure safety.

As illustrated in FIG. 8A, the first source electrode and the second source electrode are common source electrode 81. Common source electrode 81 and second gate electrode 86 are electrically short-circuited, and first drain electrode 84, and second drain electrode 85 are electrically short-circuited. Each short-circuiting may be performed by connecting these components using a wiring technique generally used for semiconductor devices.

In Embodiment 2, the first drain electrode and the second drain electrode in FIG. 2A are common drain electrode 24. In the present embodiment, the first source electrode and the second source electrode are common source electrode 81.

This configuration reduces the area of the source electrode by integrating the source electrodes of semiconductor device 801 in common source electrode 81. As a result, the gate-source capacitance is reduced and high-speed switching is possible. In addition, integrating the source electrodes in common source electrode 81 makes it possible to miniaturize the transistors and reduce the chip area.

Figure 8B:
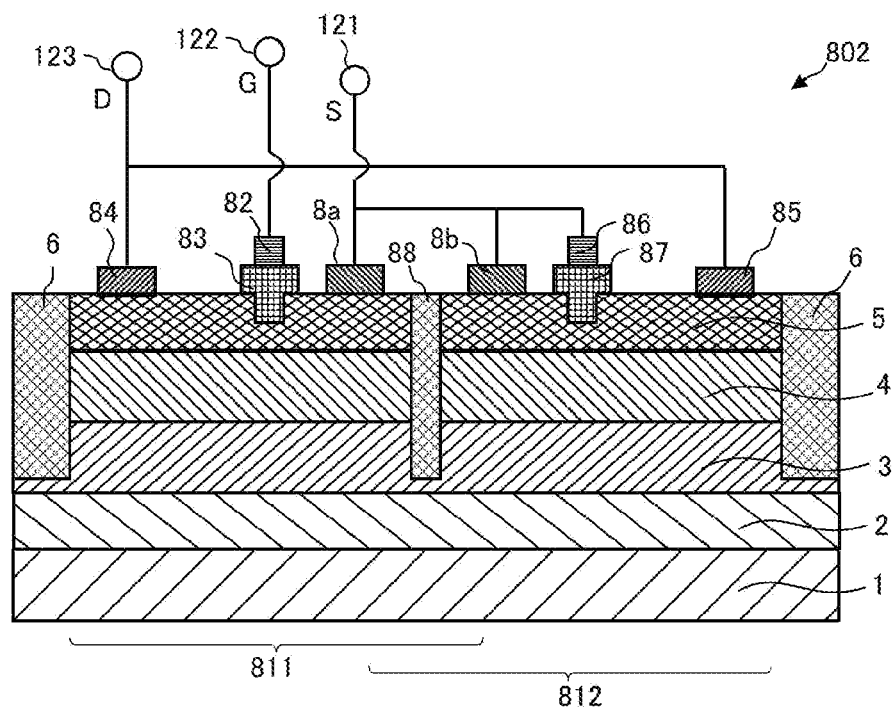
FIG. 8B is a sectional view illustrating a variation of the semiconductor device according to Embodiment 8.

Note that although common source electrode 81 is used in the present embodiment, first transistor 811 and second transistor 812 may respectively include first source electrode 8a and second source electrode 8b, as illustrated in semiconductor device 802 in FIG. 8B.

Figure 8C:
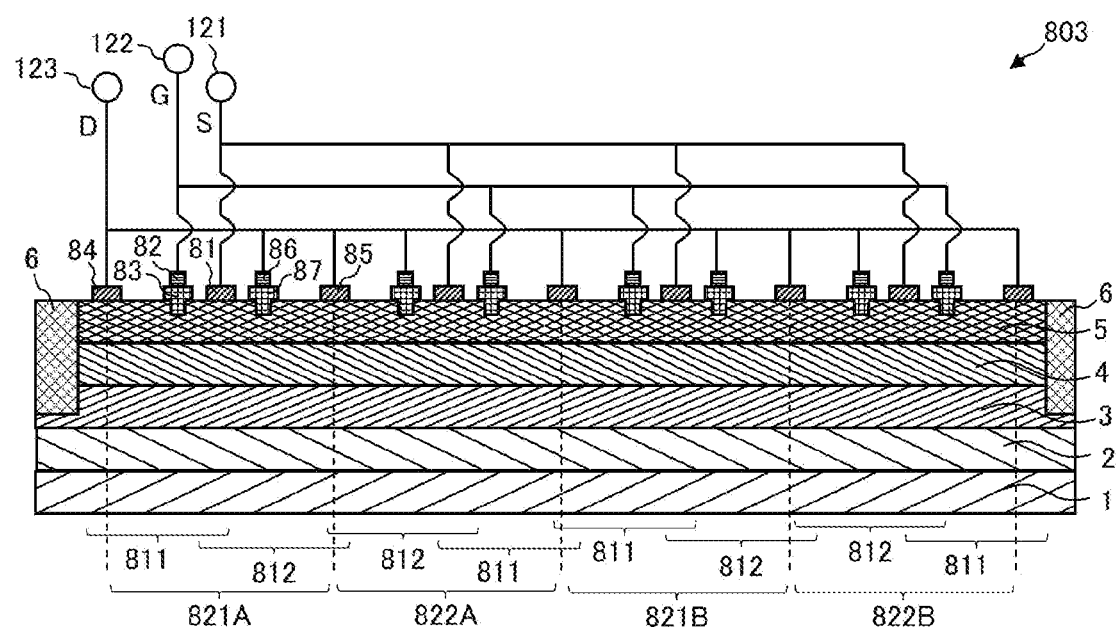
FIG. 8C is a sectional view illustrating another variation of the semiconductor device according to Embodiment 8.

In addition, as illustrated in semiconductor device 803 in FIG. 8C, it is also possible to have a layout that repeats reflection symmetry of the layouts of a plurality of unit transistors using the layout in FIG. 8A as a unit transistor, as in Embodiment 7. This makes it possible to obtain a layout of a power transistor having a desired gate width.

As described above, in the semiconductor device according to Embodiment 8, first drain electrode 84, first gate region 83, first source electrode 8a, second source electrode 8b, second gate region 87, and second drain electrode 85 are disposed in stated order in a specific direction.

With this, first source electrode 8a and second source electrode 8b can be placed close to and next to each other. This facilitates wiring and reduces wiring capacitance.

Here, first source electrode 8a and second source electrode 8b may be integrated in common source electrode 81.

With this, the integration of first source electrode 8a and second source electrode 8b can miniaturize the semiconductor device, and reduce the gate-source capacitance. This also reduces the parasitic capacitance of the wiring connected to common source electrode 81.

Here, the semiconductor device may include a plurality of unit transistors. Each of the plurality of unit transistors includes first transistor 811 and second transistor 812, the plurality of unit transistors are aligned in the specific direction, and an internal configuration of each of the plurality of unit transistors is in reflection symmetry with an internal configuration of an adjacent unit transistor in a plan view of the semiconductor substrate.

With this, a plurality of unit transistors can be efficiently arranged.

Note that in all configurations in Embodiments 1 to 8, the value of Ron·A (on-resistance×chip area), which is one of the indicators of the performance of a power transistor, generally deteriorates (increases) as the chip area increases compared with the case where a transistor-type diode is not included. However, when a GaN power transistor is operated at a high frequency of 1 MHz or more, the space between the unit transistors included in the power transistor is often intentionally increased to improve heat dissipation. If a transistor-type diode is placed between the unit transistors spaced apart widely, it is possible to achieve a high-frequency power transistor with excellent heat dissipation without deterioration of Ron·A. In addition, the region within the chip where current flows when the transistor is turned on is separated from the region within the chip where the backflow current flows when the transistor is turned off. As a result, compared to a conventional technique in which a channel of a transistor is used to allow the backflow current to flow, the temperature inside the chip is equalized because heat generation portions are dispersed. This results in a lower maximum temperature inside the chip. In other words, compared with the conventional technique, higher current and higher voltage operation is possible, and the reliability of the power transistor also improves.

Moreover, the semiconductor devices according to one or more aspects of the present disclosure have been described above on the basis of the embodiments, but the present disclosure is not limited to these embodiments. One or more aspects of the present disclosure may include, without departing from the scope of the present disclosure, one or more variations achieved by making various modifications to the present disclosure that can be conceived by those skilled in the art, or forms resulting from combining structural elements in different embodiments.

INDUSTRIAL APPLICABILITY

The semiconductor devices according the present disclosure are particularly applicable to switching transistors that operate at a high frequency of 1 MHz or more. Among them, the semiconductor devices according the present disclosure are particularly applicable to GaN power transistors.

The invention claimed is:

1. A semiconductor device comprising:
a semiconductor substrate;
a first transistor disposed above the semiconductor substrate and including a first source electrode, a first gate region, and a first drain electrode; and
a second transistor disposed above the semiconductor substrate and including a second source electrode, a second gate region, and a second drain electrode,
wherein the first source electrode, the second gate region, and the second source electrode are substantially at an identical potential, and
the first drain electrode and the second drain electrode are substantially at an identical potential.

2. The semiconductor device according to claim 1, wherein the first source electrode, the first gate region, the first drain electrode, the second drain electrode, the second gate region, and the second source electrode are disposed in stated order in a specific direction.

3. The semiconductor device according to claim 2, wherein the first drain electrode and the second drain electrode are integrated in a common drain electrode.

4. The semiconductor device according to claim 3, wherein a high resistance region is below the common drain electrode.

5. The semiconductor device according to claim 1, wherein the second gate region and the second source electrode are in contact with each other.

6. The semiconductor device according to claim 1, wherein a threshold voltage of the second transistor is a positive value lower than a threshold voltage of the first transistor.

7. The semiconductor device according to claim 1, comprising:
a first nitride semiconductor layer in which a channel of the first transistor and a channel of the second transistor are formed; and a second nitride semiconductor layer having a band gap larger than a band gap of the first nitride semiconductor layer, the first nitride semiconductor layer and the second nitride semiconductor layer being disposed above the semiconductor substrate,
wherein the first gate region and the second gate region each include a p-type nitride semiconductor.

8. The semiconductor device according to claim 7, wherein the first gate region includes:
a first portion embedded in a recessed region of the second nitride semiconductor layer; and
a first cover portion that covers the first portion,
the second gate region includes:
a second portion embedded in an other recessed region of the second nitride semiconductor layer; and
a second cover portion that covers the second portion,
wherein a depth of the second portion is less than a depth of the first portion.

9. The semiconductor device according to claim 7,
wherein the first gate region includes:
    a first portion embedded in a recessed region of the second nitride semiconductor layer; and
    a first cover portion that covers the first portion,
the second gate region includes:
    a second portion embedded in an other recessed region of the second nitride semiconductor layer; and
    a second cover portion that covers the second portion,
wherein a width of the second portion is less than a width of the first portion.

10. The semiconductor device according to claim 1,
wherein a space between the second drain electrode and the second gate region is greater than a space between the first drain electrode and the first gate region.

11. The semiconductor device according to claim 1,
wherein a space between the second drain electrode and the second gate region is less than a space between the first drain electrode and the first gate region.

12. The semiconductor device according to claim 2, comprising:
    a plurality of unit transistors,
    wherein each of the plurality of unit transistors includes the first transistor and the second transistor,
    the plurality of unit transistors are aligned in the specific direction, and
    an internal configuration of each of the plurality of unit transistors is in reflection symmetry with an internal configuration of an adjacent unit transistor in a plan view of the semiconductor substrate.

13. The semiconductor device according to claim 1,
wherein the first drain electrode, the first gate region, the first source electrode, the second source electrode, the second gate region, and the second drain electrode are disposed in stated order in a specific direction.

14. The semiconductor device according to claim 13,
wherein the first source electrode and the second source electrode are integrated in a common source electrode.

15. The semiconductor device according to claim 13, comprising:
    a plurality of unit transistors,
    wherein each of the plurality of unit transistors includes the first transistor and the second transistor,
    the plurality of unit transistors are aligned in the specific direction, and
    an internal configuration of each of the plurality of unit transistors is in reflection symmetry with an internal configuration of an adjacent unit transistor in a plan view of the semiconductor substrate.

16. The semiconductor device according to claim 1, comprising:
    a plurality of unit transistors,
    wherein each of the plurality of unit transistors includes the first transistor and the second transistor, and
    an internal configuration of each of the plurality of unit transistors is in reflection symmetry with an internal configuration of an adjacent unit transistor in a plan view of the semiconductor substrate.

* * * * *